(12) United States Patent
Hanna et al.

(10) Patent No.: US 11,335,782 B2
(45) Date of Patent: May 17, 2022

(54) OXIDE SEMICONDUCTOR THIN FILM, THIN FILM TRANSISTOR, METHOD PRODUCING THE SAME, AND SPUTTERING TARGET

(71) Applicant: ULVAC, INC., Chigasaki (JP)

(72) Inventors: Taku Hanna, Chigasaki (JP); Motoshi Kobayashi, Chigasaki (JP); Jungo Onoda, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 17/253,257

(22) PCT Filed: Jun. 19, 2019

(86) PCT No.: PCT/JP2019/024344
§ 371 (c)(1),
(2) Date: Dec. 17, 2020

(87) PCT Pub. No.: WO2019/244945
PCT Pub. Date: Dec. 26, 2019

(65) Prior Publication Data
US 2021/0257465 A1 Aug. 19, 2021

(30) Foreign Application Priority Data

Jun. 21, 2018 (JP) .............................. JP2018-117885

(51) Int. Cl.
*H01L 29/24* (2006.01)
*H01L 29/786* (2006.01)
(Continued)

(52) U.S. Cl.
CPC .......... *H01L 29/247* (2013.01); *C23C 14/086* (2013.01); *C23C 14/3407* (2013.01);
(Continued)

(58) Field of Classification Search
CPC .......... H01L 21/02565; H01L 29/78693; H01L 29/247; H01L 29/66969; H01L 21/02592;
(Continued)

(56) References Cited

U.S. PATENT DOCUMENTS

2009/0090914 A1  4/2009  Yano et al.
2010/0129660 A1  5/2010  Nakayama et al.
(Continued)

FOREIGN PATENT DOCUMENTS

JP  2009-31750 A  2/2009
JP  2011-216574 A  10/2011
(Continued)

OTHER PUBLICATIONS

International Search Report in International Application No. PCT/JP2019/024344, filed Jun. 19, 2019.

*Primary Examiner* — Thanh Y. Tran
(74) *Attorney, Agent, or Firm* — Saliwanchik, Lloyd & Eisenchenk

(57) ABSTRACT

[Solving Means] An oxide semiconductor thin film according to an embodiment of the present invention includes: an oxide semiconductor that mainly contains In, Sn, and Ge. An atom ratio of Ge/(In+Sn+Ge) is 0.07 or more and 0.40 or less. As a result, it is possible to achieve transistor characteristics with a mobility of 10 cm$^2$/Vs or more.

10 Claims, 5 Drawing Sheets

(51) Int. Cl.
  *C23C 14/08*    (2006.01)
  *C23C 14/34*    (2006.01)
  *H01L 21/02*    (2006.01)
  *H01L 29/66*    (2006.01)
  *H01L 27/12*    (2006.01)

(52) U.S. Cl.
  CPC .. *H01L 21/02565* (2013.01); *H01L 21/02592* (2013.01); *H01L 21/02631* (2013.01); *H01L 29/66969* (2013.01); *H01L 29/78693* (2013.01); *H01L 27/1225* (2013.01)

(58) Field of Classification Search
  CPC . H01L 29/786; H01L 29/7869; C23C 14/086; C23C 14/3407
  See application file for complete search history.

(56) References Cited

U.S. PATENT DOCUMENTS

| | | | |
|---|---|---|---|
| 2011/0136301 A1* | 6/2011 | Yamazaki | H01L 29/78648 438/156 |
| 2012/0149147 A1* | 6/2012 | Yamazaki | H01L 21/465 438/104 |
| 2013/0032798 A1 | 2/2013 | Miki et al. | |
| 2013/0087782 A1 | 4/2013 | Yamazaki et al. | |
| 2013/0240802 A1 | 9/2013 | Miki et al. | |
| 2014/0139772 A1 | 5/2014 | Kim et al. | |
| 2015/0155373 A1* | 6/2015 | Yamazaki | H01L 21/28176 438/104 |
| 2017/0063351 A1 | 3/2017 | Kurokawa | |
| 2019/0006473 A1* | 1/2019 | Tsuruma | H01L 29/872 |
| 2019/0123207 A1* | 4/2019 | Goto | H01L 29/24 |
| 2019/0288115 A1 | 9/2019 | Goto et al. | |

FOREIGN PATENT DOCUMENTS

| | | |
|---|---|---|
| JP | 2012-33854 A | 2/2012 |
| JP | 2013-70010 A | 4/2013 |
| JP | 2013-93561 A | 5/2013 |
| JP | 2014-103379 A | 6/2014 |
| JP | 2015-30896 A | 2/2015 |
| JP | 2017-54502 A | 3/2017 |
| WO | WO-2007/058248 A1 | 5/2007 |
| WO | WO-2009/008297 A1 | 1/2009 |
| WO | WO-2010/092810 A1 | 8/2010 |
| WO | WO-2018/074083 A1 | 4/2018 |

* cited by examiner

OXIDE SEMICONDUCTOR THIN FILM, THIN FILM TRANSISTOR, METHOD PRODUCING THE SAME, AND SPUTTERING TARGET

CROSS-REFERENCE TO RELATED APPLICATIONS

This application is the U.S. national stage application of International Patent Application No. PCT/JP2019/024344, filed Jun. 19, 2019, which claims the benefit under 35 U.S.C. § 119 of Japanese Application No. 2018-117885, filed Jun. 21, 2018, the disclosures of each of which are incorporated herein by reference in their entirety.

TECHNICAL FIELD

The present invention relates to, for example, an oxide semiconductor thin film used as an active layer (channel layer) of a thin film transistor, a thin film transistor including the same, a method of producing the same, and a sputtering target for producing the oxide semiconductor thin film.

BACKGROUND ART

In recent years, a thin film transistor (TFT: Thin-Film Transistor) using an In—Ga—Zn—O oxide semiconductor film (IGZO) for an active layer has been widely applied to various displays because it is possible to obtain a high mobility as compared with TFTs using existing amorphous silicon films for an active layer (see, for example, Patent Literatures 1 to 3).

For example, Patent Literature 1 disclose an organic EL display device in which an active layer of a TFT for driving an organic EL element is formed of IGZO. Patent Literature 2 discloses a thin film transistor in which a channel layer (active layer) is formed of a-IGZO and a mobility is 5 cm$^2$/Vs or more. Further, Patent Literature 3 discloses a thin film transistor in which an active layer is formed of IGZO and the on/off current ratio is 5 digits or more.

CITATION LIST

Patent Literature

Patent Literature 1: Japanese Patent Application Laid-open No. 2009-31750
Patent Literature 2: Japanese Patent Application Laid-open No. 2011-216574
Patent Literature 3: WO2010/092810

DISCLOSURE OF INVENTION

Technical Problem

In recent years, there has been an increasing demand for an oxide semiconductor exhibiting a higher mobility from the demand for higher resolution, lower power consumption, and higher frame rates in various displays. However, in a thin film transistor using IGZO for an active layer, it is difficult to obtain values exceeding 10 cm$^2$/Vs of a mobility, and there is a need to develop materials exhibiting a higher mobility for thin film transistor applications.

In view of the circumstances as described above, it is an object of the present invention to provide an oxide semiconductor thin film having high characteristics to replace IGZO, a thin film transistor including the same, a method of producing the same, and a sputtering target for producing the oxide semiconductor thin film.

Solution to Problem

In order to achieve the above-mentioned object, an oxide semiconductor thin film according to an embodiment of the present invention includes an oxide semiconductor that mainly contains In, Sn, and Ge.

An atom ratio of Ge/(In+Sn+Ge) is 0.07 or more and 0.40 or less.

As a result, it is possible to achieve transistor characteristics with a mobility of 10 cm$^2$/Vs or more.

By setting the atom ratio of Ge/(In+Sn+Ge) to 0.07 or more, it is possible to obtain an amorphous oxide semiconductor thin film without depending on the content of Sn.

An atom ratio of Sn/(In+Sn+Ge) may be 0.04 or more and 0.60 or less.

By setting the atom ratio of Sn/(In+Sn+Ge) to 0.04 or more, it is possible to obtain an oxide semiconductor thin film having a carrier concentration of $5 \times 10^{19}$ or less.

By setting the atom ratio of Sn/(In+Sn+Ge) to 0.60 or less, it is possible to obtain an oxide semiconductor thin film having a mobility of 10 or more without depending on the content of Ge.

An atom ratio of In/(In+Sn+Ge) may be 0.3 or more and the atom ratio of Ge/(In+Sn+Ge) may be 0.10 or more and 0.25 or less. As a result, it is possible to obtain an amorphous oxide semiconductor thin film without depending on the content of Sn.

The oxide semiconductor may further contain a first element that is at least one element selected from the group consisting of Si, Ti, Mg, Ca, Ba, Zr, Al, W, Ta, Hf, and B.

Alternatively, the oxide semiconductor may further contain a second element that is at least one element selected from the group consisting of Sr, Ga, and Zn.

A thin film transistor according to an embodiment of the present invention includes an active layer including the oxide semiconductor thin film having the above-mentioned configuration.

A method of producing a thin film transistor according to an embodiment of the present invention is a method of producing a thin film transistor including an active layer including the oxide semiconductor thin film having the above-mentioned configuration, including:
  forming a gate insulation film on a gate electrode;
  forming the active layer on the gate insulation film by a sputtering method;
  forming a metal layer using the active layer as a base layer; and
  forming a source electrode and a drain electrode by patterning the metal layer by a wet etching method.

A sputtering target according to an embodiment of the present invention includes a sintered body of an oxide semiconductor containing In, Sn, and Ge as main components.

An atom ratio of Ge/(In+Sn+Ge) is 0.07 or more and 0.40 or less.

Advantageous Effects of Invention

As described above, in accordance with the present invention, for example, it is possible to provide a thin film transistor having high characteristics to replace IGZO.

MODE(S) FOR CARRYING OUT THE INVENTION

Hereinafter, an embodiment of the present invention will be described with reference to the drawings.

Figure 1:
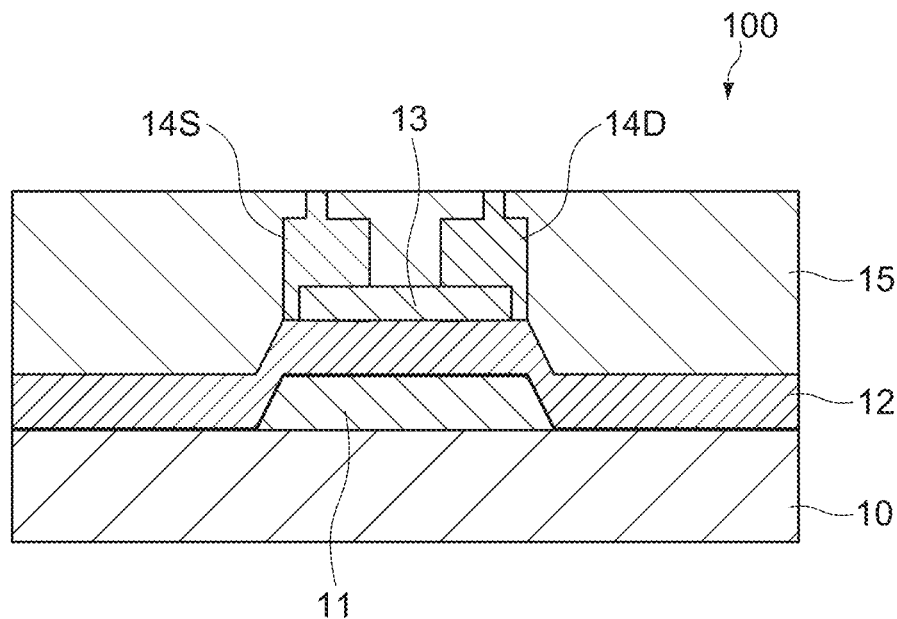
FIG. 1 is a schematic cross-sectional view showing a configuration of a thin film transistor according to an embodiment of the present invention.

FIG. 1 is a schematic cross-sectional view showing a configuration of a thin film transistor according to an embodiment of the present invention. In this embodiment, a so-called bottom-gate type field-effect transistor will be described as an example.

[Thin Film Transistor]

A thin film transistor 100 according to this embodiment includes a gate electrode 11, a gate insulation film 12, an active layer 13, a source electrode 14S, and a drain electrode 14D.

The gate electrode 11 includes a conductive film formed on the surface of a base material 10. The base material 10 is typically a transparent glass substrate. The gate electrode 11 typically includes a metal single layer film or a metal multilayer film of molybdenum (Mo), titanium (Ti), aluminum (Al), copper (Cu), or the like, and is formed by, for example, a sputtering method. In this embodiment, the gate electrode 11 is formed of molybdenum. The thickness of the gate electrode 11 is not particularly limited, and is, for example, 200 nm. The gate electrode 11 is deposited by, for example, a sputtering method, a vacuum evaporation method, or the like.

The active layer 13 functions as a channel layer of the thin film transistor 100. The film thickness of the active layer 12 is, for example, 10 nm to 200 nm. The active layer 13 includes an In—Sn—Ge—O oxide semiconductor thin film containing In (indium), Sn (tin), and Ge (germanium). The active layer 13 is deposited by, for example, a sputtering method. The specific composition of the above-mentioned oxide semiconductor thin film will be described below.

The gate insulation film 12 is formed between the gate electrode 11 and the active layer 13. The gate insulation film 12 includes, for example, a silicon oxide film (SiOx), a silicon nitride film (SiNx), or a stacked film thereof. The deposition method is not particularly limited, and may be a CVD method, a sputtering method, an evaporation method, or the like. The film thickness of the gate insulation film 12 is not particularly limited, and is, for example, 200 nm to 400 nm.

The source electrode 14S and the drain electrode 14D are formed on the active layer 13 at a distance from each other. The source electrode 14S and the drain electrode 14D may include, for example, a metal single layer film of aluminum, molybdenum, copper, titanium, or the like, or a multilayer film of these metals. As will be described below, the source electrode 14S and the drain electrode 14D can be simultaneously formed by patterning the metal film. The thickness of the metal film is, for example, 100 nm to 200 nm. The source electrode 14S and the drain electrode 14D are formed by, for example, a sputtering method, a vacuum evaporation method, or the like.

The source electrode 14S and the drain electrode 14D are coated with a protective film 15. The protective film 15 is formed of an electrically insulating material such as a silicon oxide film, a silicon nitride film, and a stacked film thereof. The protective film 15 is for shielding the device portion including the active layer 13 from the outside air. The film thickness of the protective film 15 is not particularly limited, and is, for example, 100 nm to 300 nm. The protective film 15 is formed by, for example, a CVD method.

After forming the protective film 15, annealing treatment is performed. As a result, the active layer 13 is activated. The annealing condition is not particularly limited, and is performed at approximately 300° C. for 1 hour in the atmosphere in this embodiment.

The protective film 15 is provided with an interlayer connecting hole for connecting the source and drain electrode 14S and 14D to a wiring layer (not shown) at an appropriate position. The above-mentioned wiring layer is for connecting the thin film transistor 100 to a peripheral circuit (not shown), and includes a transparent conductive film such as ITO.

[Oxide Semiconductor Thin Film]

Subsequently, an oxide semiconductor thin film forming the active layer 13 will be described.

Typical oxide semiconductor materials having a high mobility are ITO (In—Sn—O) and IGZO (In—Ga—Zn—O). Since these oxide semiconductor materials have amorphous crystallinity immediately after deposition, they can be easily patterned by a wet etching method. After the patterning, they are activated by heat treatment to express desired transistor characteristics.

Generally, as the mobility of the high-mobility oxide increases, it becomes difficult to suppress the fluctuation of the gate threshold voltage to a predetermined value or less. Therefore, there is a problem that it is difficult to ensure a highly-reliable switching operation over a long period of time. Since oxygen deficiency occurs as a cause of these problems, a small amount of a material strongly bonded to oxygen, such as Hf (hafnium), Ti (titanium), and W (tungsten), is widely added as a carrier killer. However, in order to ensure the desired reliability, a sufficient amount of these elements needs to be added. Meanwhile, addition of a large amount of the carrier killer element conversely leads to a decrease in mobility.

Meanwhile, the present inventors have found that by adding a predetermined amount or more of Ge that is effective as a carrier killer and has a low reduction rate of a mobility to In as a base, both mobility and reliability are enhanced as compared with those of the existing ITO material and IGZO material.

Figure 2:
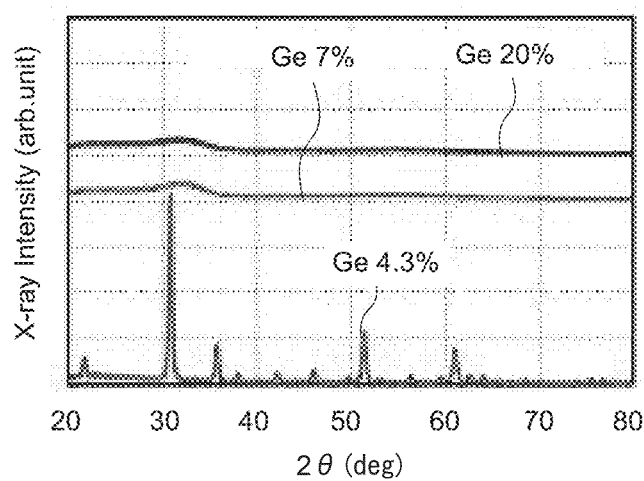
FIG. 2 shows the results of evaluating the content (atomic %) of Ge in an In—Ge—O material deposited by a sputtering method and the crystallinity of the resulting thin film.

For example, FIG. 2 shows the experimental results of evaluating the content (atomic %) of Ge in an In—Ge—O material deposited by a sputtering method and the crystallinity of the resulting thin film. Here, a thin film sample annealed at 350° C. for 1 hour in the atmosphere after deposition was evaluated. As shown in the figure, while the sample in which the content of Ge was 4.3 atomic % was crystalline, the samples in which the content of Ge was 7% and 20% were amorphous.

Figure 3:
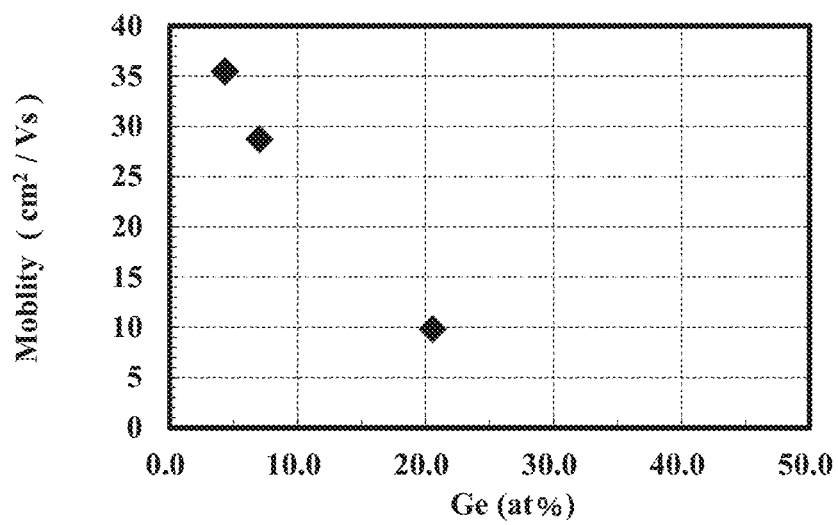
FIG. 3 shows the results of an experiment showing the Ge-concentration dependency of the mobility in the In—Ge—O material.
Figure 4:
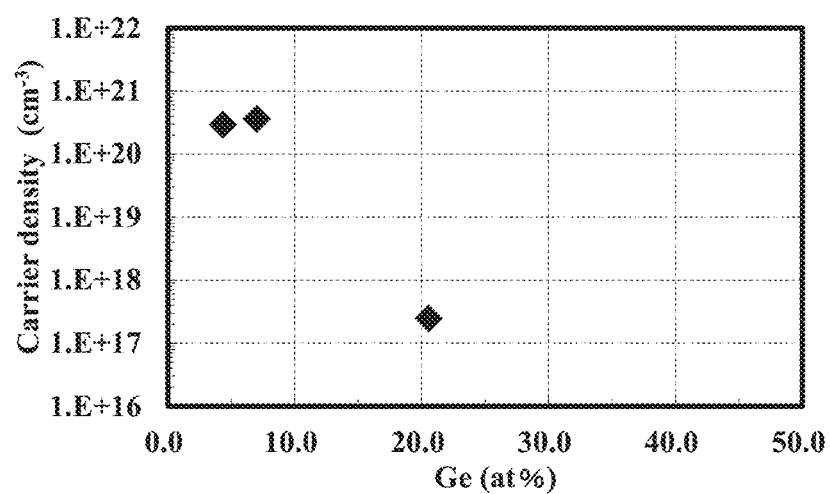
FIG. 4 shows the results of an experiment showing the Ge-concentration dependency of the carrier concentration in the In—Ge—O material.

Meanwhile, FIG. 3 and FIG. 4 respectively show the results of measuring the mobility and carrier concentration of the above-mentioned samples by a Hall effect measuring instrument. As shown in FIG. 3, the mobility tends to decrease as the content of Ge increases. As shown in FIG. 4, regarding the carrier concentration, the samples in which the content of Ge is 4.3 atomic % and 11 atomic % exhibit a high value of $1\times10^{20}$ (/cm$^3$), but the sample in which the content of Ge is 20 atomic % exhibits a value reduced to $1\times10^{18}$ (/cm$^3$) or less. The favorable range of carrier concentration is generally on the order of $10^{18}$ to $10^{19}$ (/cm$^3$). When the carrier concentration is less than $1\times10^{18}$ (/cm$^3$), the decrease in mobility becomes remarkable. When the carrier concentration exceeds $1\times10^{20}$ (/cm$^3$), the decrease in reliability of the switching operation becomes remarkable.

From the results of FIG. 2 to FIG. 4, it was confirmed that by setting the content of Ge to 7 atomic % or more, an amorphous oxide thin film could be obtained and a sufficient effect as a carrier killer could be obtained.

Subsequently, FIG. 5 and FIG. 6 respectively show the Sn-concentration dependency of the crystallinity and the mobility in an In—Sn—Ge—O material. A Hall effect measuring instrument was used to measure the mobility. Here, the content of Ge was fixed to 12 atomic %, and a thin film sample annealed at 350° C. ("♦" in FIG. 6) and 400° C. ("◇" in FIG. 6) for 1 hour in the atmosphere after deposition was evaluated.

Figure 5:
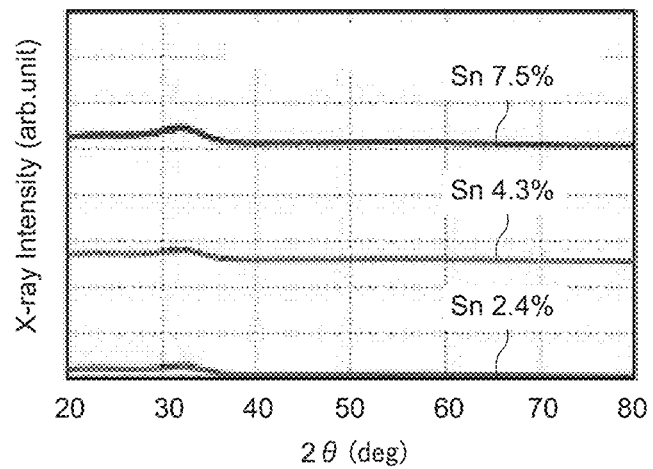
FIG. 5 shows the results of an experiment showing the Sn-concentration dependency of the crystallinity in an In—Sn—Ge—O material.
Figure 6:
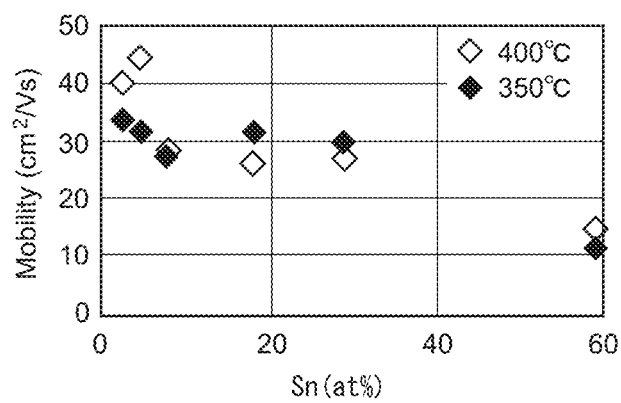
FIG. 6 shows the results of an experiment showing the Sn-concentration dependency of the mobility in the In—Sn—Ge—O material.

As shown in FIG. 5, any of the samples in which the content of Sn was 2.4 atomic %, 4.3 atomic %, and 7.5 atomic % was amorphous. Therefore, independent of the content of Sn, an In—Sn—Ge—O oxide thin film deposited by a sputtering method is presumed to be amorphous. Meanwhile, as shown in FIG. 6, no significant decrease in mobility was observed (approximately around 30 cm$^2$/Vs) until the content of Sn reached 30 atomic %, and a mobility of 10 cm$^2$/Vs or more was obtained even in the case where the content of Sn was increased to 60 atomic %.

Subsequently, FIG. 7 and FIG. 8 respectively show the Ge-concentration dependency of the mobility and carrier concentration in an In—Sn—Ge—O material deposited by fixing the content of Sn to 5 atomic %. A Hall effect measuring instrument was used to measure the mobility and carrier concentration. Here, a three-way sputtering method in which three targets of indium oxide, germanium oxide, and tin oxide are simultaneously sputtered under an oxygen atmosphere was adopted. Thin film samples annealed at 350° C. ("♦" in each figure) and 400° C. ("◇" in each figure) for 1 hour in the atmosphere after deposition were evaluated.

Figure 7:
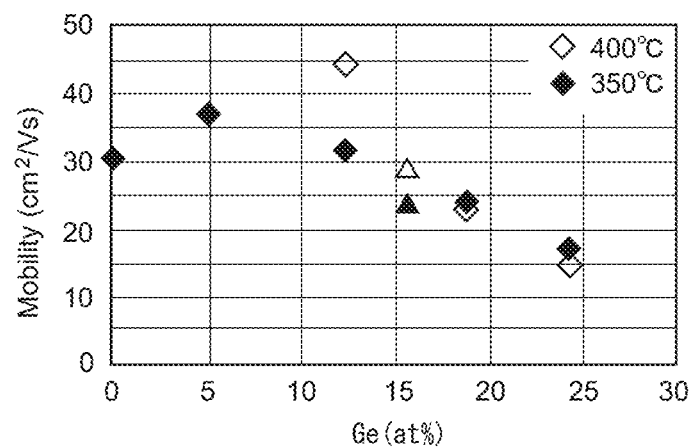
FIG. 7 shows the results of an experiment showing the Ge-concentration dependency of the mobility in the In—Sn—Ge—O material deposited by fixing the content of Sn to 5 atomic %.

As shown in FIG. 7, it was confirmed that the mobility was 10 cm$^2$/Vs or more for all the samples. Further, as shown in FIG. 7 and FIG. 8, it was confirmed that the mobility was 15 cm$^2$/Vs or more and the carrier concentration was between $1\times10^{18}$ to $1\times10^{19}$ (/cm$^3$) in the case where the content of Ge was in the range 10 to 25 atomic %.

Figure 8:
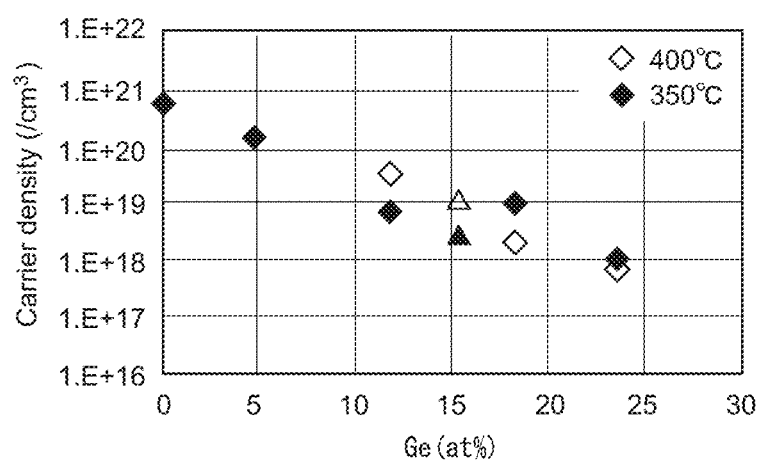
FIG. 8 shows the results of an experiment showing the Ge-concentration dependency of the carrier concentration in the In—Sn—Ge—O material deposited by fixing the content of Sn to 5 atomic %.

Note that although the evaluation results of FIG. 7 and FIG. 8 are for samples deposited by three-way sputtering, FIG. 7 and FIG. 8 also show the mobility and carrier concentration measured on samples deposited using an In—Sn—Ge—O sintered body target having the content of Ge of 15 atomic % (content of Sn of 5 atomic %). In each figure, "▲" indicates a thin film sample annealed at 350° C. for 1 hour in the atmosphere, and "△" indicates a thin film samples annealed at 400° C. for 1 hour in the atmosphere. As shown in FIG. 7 and FIG. 8, it was confirmed that even the sintered body target exhibited the same electrical characteristics as those of the sample deposited by a three-way sputtering method, the mobility was approximately 20 to 30 cm$^2$/Vs and the carrier concentration was approximately $5\times10$ to $1\times10^{19}$ (/cm$^3$).

Figure 9:
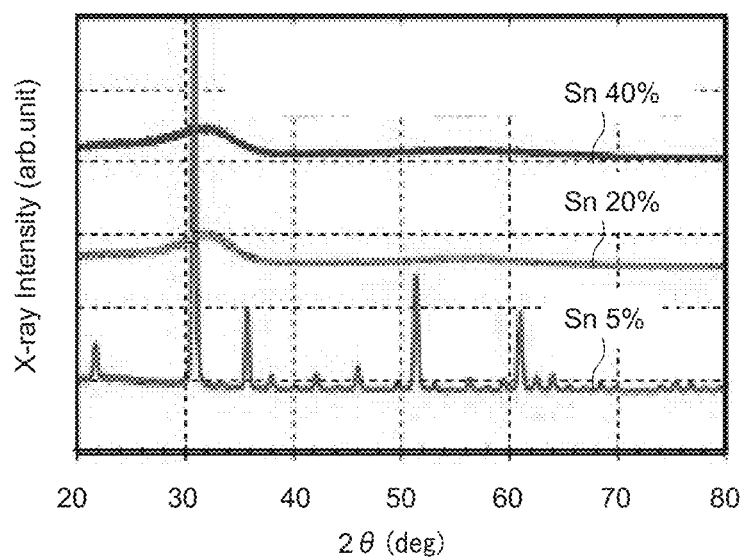
FIG. 9 shows the results of evaluating the crystallinity of thin films obtained by fixing the content of Ge to 5 atomic % and setting the content of Sn to 5 atomic %, 20 atomic %, and 40 atomic %.

Meanwhile, as described above, an amorphous thin film can be obtained when the content of Ge is 12 atomic % or more, but an amorphous thin film can also be obtained by increasing the content of Sn instead of Ge. FIG. 9 shows the results of evaluating the crystallinity of thin films obtained by fixing the content of Ge to 5 atomic % and setting the content of Sn to 5 atomic %, 20 atomic %, and 40 atomic %. Here, a thin film sample annealed at 350° C. for 1 hour in the atmosphere after deposition was evaluated. As shown in the figure, by setting the content of Sn to 20 atomic % or more, an amorphous In—Sn—Ge—O thin film can be obtained.

As described above, the active layer 13 according to this embodiment includes an oxide semiconductor thin film containing In, Sn, and Ge. The atom ratio of Ge/(In+Sn+Ge) is 0.07 or more and 0.4 or less.

Note that the upper limit value and the lower limit value of the composition are rounded off to three decimal places (the same applies hereinafter).

By forming the active layer 13 of an In—Sn—Ge—O oxide semiconductor thin film having the above-mentioned composition range, transistor characteristics having a mobility of 10 cm$^2$/Vs or more can be obtained.

As the active layer 13, by setting the atom ratio of Sn/(In+Sn+Ge) to 0.03 or more and 0.60 or less, an amorphous In—Sn—Ge—O oxide semiconductor thin film can be obtained. Therefore, the active layer 13 can be easily patterned using, for example, an oxalic acid etchant.

Further, since the active layer 13 includes an oxide semiconductor thin film containing Sn, it is possible to enhance the chemical resistance of the active layer 13. Therefore, during the patterning process of the source electrode 14S and the drain electrode 14D, there is no need to provide an etching stopper layer for protecting the active layer from the etchant. Thus, after forming a metal layer including the active layer 13 as a base layer, the source electrode 14S and the drain electrode 14D can be easily formed by patterning the metal layer by a wet etching method.

Typically, an oxalic acid etchant (95% oxalic acid) can be used as the etchant. Examples thereof include ITO-06N (Kanto Chemical CO., Inc.).

In the oxide semiconductor thin film constituting the active layer 13, the atom ratio of Ge/(In+Sn+Ge) is 0.07 or more and 0.40 or less, more favorably 0.10 or more and 0.25 or less. Thus, an amorphous oxide semiconductor thin film can be obtained without depending on the content of Sn. Further, by setting the content of Ge within the above-mentioned range, a high mobility of 15 to 35 cm$^2$/Vs and low carrier concentration of equal to or less than the order of $10^{19}$ (/cm$^3$) can be achieved at the same time in the case where the atom ratio of In/(In+Sn+Ge) is 0.3 or more.

The oxide semiconductor thin film constituting the active layer 13 may further contain a first element (α), which is at least one element selected from the group consisting of Si (silicon), Ti (titanium), Mg (magnesium), Ca (calcium), Zr (zirconium), Al (aluminum), W (tungsten), Ta (tantalum), Hf (hafnium), and B (boron). The first element (α) is an element that functions as a carrier killer, and is capable of contributing to reduce the carrier concentration in the thin film to increase the reliability of the switching operation.

The amount of the first element (α) to be added is not particularly limited, and, for example, the atom ratio of α/(In+Sn+Ge+α) is 0.10 or less. Thus, while reducing the carrier concentration to $10^{18}$ (/cm$^3$) order or less, it is possible to stably realize a high mobility of 10 cm$^2$/Vs or more.

Alternatively, the oxide semiconductor thin film constituting the active layer 13 may further contain a second element (β), which is at least one element selected from the group consisting of Sr (strontium), Ga (gallium), and Zn (zinc). Although these second elements (β) also do not have sufficient performance as carrier killers, they are additive elements with less reduction in mobility, and contribute to improved crystallinity and reduction in carrier concentration in a thin film, whereby the reliability of a switching operation can be enhanced.

The amount of the second element (β) to be added is not particularly limited, and, for example, the atom ratio of β/(In+Sn+Ge+β) is 0.25 or less. Thus, while reducing the carrier concentration to $10^{18}$ (/cm$^3$) order or less, it is possible to stably realize a high mobility of 10 cm$^2$/Vs or more.

In the thin film transistor 100 including the active layer 13 according to this embodiment configured as described above, since the fluctuation of the threshold voltage can be suppressed to a predetermined voltage or less, it is possible to ensure reliable a switching operation over a long period of time. For example, in a BTS test in which a constant voltage is continuously applied between the gate electrode and the source electrode (or between the gate electrode and the source electrode and between the drain electrode and the source electrode) to evaluate the fluctuation of the threshold voltage at that time, favorable results were obtained for both PBTS (Positive Bias Temperature Stress) and NBTS (Negative Bias Temperature Stress) as confirmed by the present inventors.

Specifically, at a temperature of 60° C., the amount of change in the threshold voltage before and after the implementation of a PBTS test to continue applying a gate voltage of +30 V for 60 minutes was 0 V or more and 1 V or less.

Further, at a temperature of 60° C., the amount of change in the threshold voltage before and after the implementation of an NBTS test to continue applying a gate voltage of −30 V for 60 minutes was −1 V or more and 0 V or less.

The active layer 13 is formed by performing deposition using a sputtering target including sintered bodies of oxides of In, Sn, and Ge, followed by heat treatment (annealing) at a predetermined temperature. By sputtering the above-mentioned target under predetermined conditions, an oxide semiconductor thin film having the same composition as or substantially the same composition as the composition of the target is formed. By annealing the semiconductor thin film at a predetermined temperature, the active layer 13 having transistor characteristics with a mobility of 10 cm$^2$/Vs or more is formed, for example.

The above-mentioned sputtering target can include a sintered body obtained by using oxides of In, Sn, and Ge, such as $In_2O_3$, $SnO_2$, and $GeO_2$, as raw material powders and mixing these oxides at the above-mentioned composition ratio.

Example

The present inventors formed In—Sn—Ge—O oxide thin films by a sputtering method, and evaluated the basic electric characteristics (mobility and carrier concentration) of these films using a Hall effect measuring instrument.

The mobility and carrier concentration were measured using a Hall effect measuring instrument after the oxide semiconductor thin films immediately after deposition were annealed at 350° C. for 1 hour in the atmosphere.

Regarding the crystallinity, by measuring the X-ray diffraction pattern of the thin film using an X-ray diffraction measuring device, the measured pattern was evaluated as crystalline when a significant peak was observed, and a broad pattern without significant peaks (halo pattern) was evaluated as amorphous.

As a deposition condition, the substrate temperature was 100° C., the sputtering gas was a mixed gas of argon and oxygen (oxygen content ratio of 7%), and the film thickness was 50 nm.

Example 1

(Sample 1-1)
Using an In—Sn—O target, an In—Sn—O oxide semiconductor thin film in which the atom ratio of the respective elements in the total amount of In and Sn was In: 98 atomic % and Sn:2 atomic % was prepared on a glass substrate. The resulting thin film was crystalline.

As a result of evaluating the electric characteristics of the prepared oxide semiconductor thin film, the mobility was 7.4 cm$^2$/Vs and the carrier concentration was 5.6E+20 (5.6×10$^{20}$)/cm$^3$.

(Sample 1-2)
Using an In—Sn—Ge—O target, an In—Sn—Ge—O oxide semiconductor thin film in which the atom ratio of the respective elements in the total amount of In, Sn, and Ge was In: 93 atomic %, Sn: 2 atomic %, and Ge: 5 atomic % was prepared on a glass substrate. The resulting thin film was crystalline.

As a result of evaluating the electric characteristics of the prepared oxide semiconductor thin film, the mobility was 37.1 cm$^2$/Vs and the carrier concentration was 1.7E+20 (1.7×10$^{20}$)/cm$^3$.

(Sample 1-3)
Using an In—Sn—Ge—O target, an In—Sn—Ge—O oxide semiconductor thin film in which the atom ratio of the respective elements in the total amount of In, Sn, and Ge was In: 91 atomic %, Sn: 2 atomic %, and Ge: 7 atomic % was prepared on a glass substrate. The resulting thin film was amorphous.

As a result of evaluating the electric characteristics of the prepared oxide semiconductor thin film, the mobility was 35.2 cm$^2$/Vs and the carrier concentration was 4.6E+19 (4.6×10$^{19}$)/cm$^3$.

(Sample 1-4)
Using an In—Sn—Ge—O target, an In—Sn—Ge—O oxide semiconductor thin film in which the atom ratio of the respective elements in the total amount of In, Sn, and Ge was In: 85 atomic %, Sn: 2 atomic %, and Ge: 13 atomic % was prepared on a glass substrate. The resulting thin film was amorphous.

As a result of evaluating the electric characteristics of the prepared oxide semiconductor thin film, the mobility was 33.9 cm$^2$/Vs and the carrier concentration was 7.9E+18 (7.9×10$^{18}$)/cm$^3$.

(Sample 1-5)
Using an In—Sn—Ge—O target, an In—Sn—Ge—O oxide semiconductor thin film in which the atom ratio of the respective elements in the total amount of In, Sn, and Ge was In: 73 atomic %, Sn: 2 atomic %, and Ge: 25 atomic % was prepared on a glass substrate. The resulting thin film was amorphous.

As a result of evaluating the electric characteristics of the prepared oxide semiconductor thin film, the mobility was 14.7 cm$^2$/Vs and the carrier concentration was 9.6E+17 ($9.6 \times 10^{17}$)/cm$^3$.

(Sample 1-6)

Using an In—Sn—Ge—O target, an In—Sn—Ge—O oxide semiconductor thin film in which the atom ratio of the respective elements in the total amount of In, Sn, and Ge was In: 58 atomic %, Sn: 2 atomic %, and Ge: 40 atomic % was prepared on a glass substrate. The resulting thin film was amorphous.

As a result of evaluating the electric characteristics of the prepared oxide semiconductor thin film, the mobility was 10.2 cm$^2$/Vs and the carrier concentration was 3.8E+16 ($3.8 \times 10^{16}$)/cm$^3$.

The results of Example 1 are summarized in Table 1

TABLE 1

| No. | Composition at % | | | Carrier concentration (/cm$^3$) | mobility (cm$^2$/Vs) | Amorphous |
|---|---|---|---|---|---|---|
| | In | Sn | Ge | | | |
| 1-1 | 98 | 2 | 0 | 5.6E+20 | 7.4 | x |
| 1-2 | 93 | 2 | 5 | 1.7E+20 | 37.1 | x |
| 1-3 | 91 | 2 | 7 | 4.6E+19 | 35.2 | ○ |
| 1-4 | 85 | 2 | 13 | 7.9E+18 | 33.9 | ○ |
| 1-5 | 73 | 2 | 25 | 9.6E+17 | 14.7 | ○ |
| 1-6 | 58 | 2 | 40 | 3.8E+16 | 10.2 | ○ |

Example 2

(Sample 2-1)

Using an In—Sn—O target, an In—Sn—O oxide semiconductor thin film in which the atom ratio of the respective elements in the total amount of In and Sn was In: 94.7 atomic % and Sn: 5.3 atomic % was prepared on a glass substrate. The resulting thin film was crystalline.

As a result of evaluating the electric characteristics of the prepared oxide semiconductor thin film, the mobility was 31.0 cm$^2$/Vs and the carrier concentration was 6.4E+20 ($6.4 \times 10^{20}$)/cm$^3$.

(Sample 2-2)

Using an In—Sn—Ge—O target, an In—Sn—Ge—O oxide semiconductor thin film in which the atom ratio of the respective elements in the total amount of In, Sn, and Ge was In: 90.2 atomic %, Sn: 4.9 atomic %, and Ge: 4.9 atomic % was prepared on a glass substrate. The resulting thin film was crystalline.

As a result of evaluating the electric characteristics of the prepared oxide semiconductor thin film, the mobility was 36.5 cm$^2$/Vs and the carrier concentration was 1.6E+20 ($1.6 \times 10^{20}$)/cm$^3$.

(Sample 2-3)

Using an In—Sn—Ge—O target, an In—Sn—Ge—O oxide semiconductor thin film in which the atom ratio of the respective elements in the total amount of In, Sn, and Ge was In: 88.5 atomic %, Sn: 4.5 atomic %, and Ge: 7 atomic % was prepared on a glass substrate. The resulting thin film was amorphous.

As a result of evaluating the electric characteristics of the prepared oxide semiconductor thin film, the mobility was 33.2 cm$^2$/Vs and the carrier concentration was 9.8E+18 ($9.8 \times 10^{18}$)/cm$^3$.

(Sample 2-4)

Using an In—Sn—Ge—O target, an In—Sn—Ge—O oxide semiconductor thin film in which the atom ratio of the respective elements in the total amount of In, Sn, and Ge was In: 83.5 atomic %, Sn: 4.3 atomic %, and Ge: 12.2 atomic % was prepared on a glass substrate. The resulting thin film was amorphous.

As a result of evaluating the electric characteristics of the prepared oxide semiconductor thin film, the mobility was 31.7 cm$^2$/Vs and the carrier concentration was 7.4E+18 ($7.4 \times 10^{18}$)/cm$^3$.

(Sample 2-5)

Using an In—Sn—Ge—O target, an In—Sn—Ge—O oxide semiconductor thin film in which the atom ratio of the respective elements in the total amount of In, Sn, and Ge was In: 77.1 atomic %, Sn: 4.2 atomic %, and Ge: 18.7 atomic % was prepared on a glass substrate. The resulting thin film was amorphous.

As a result of evaluating the electric characteristics of the prepared oxide semiconductor thin film, the mobility was 24.5 cm$^2$/Vs and the carrier concentration was 8.9E+18 ($8.9 \times 10^{18}$)/cm$^3$.

(Sample 2-6)

Using an In—Sn—Ge—O target, an In—Sn—Ge—O oxide semiconductor thin film in which the atom ratio of the respective elements in the total amount of In, Sn, and Ge was In: 71.9 atomic %, Sn: 4 atomic %, and Ge: 24.1 atomic % was prepared on a glass substrate. The resulting thin film was amorphous.

As a result of evaluating the electric characteristics of the prepared oxide semiconductor thin film, the mobility was 17.1 cm$^2$/Vs and the carrier concentration was 9.5E+17 ($9.5 \times 10^{17}$)/cm$^3$.

(Sample 2-7)

Using an In—Sn—Ge—O target, an In—Sn—Ge—O oxide semiconductor thin film in which the atom ratio of the respective elements in the total amount of In, Sn, and Ge was In: 55.5 atomic %, Sn: 4.5 atomic %, and Ge: 40 atomic % was prepared on a glass substrate. The resulting thin film was amorphous.

As a result of evaluating the electric characteristics of the prepared oxide semiconductor thin film, the mobility was 10.2 cm$^2$/Vs and the carrier concentration was 4.5E+16 ($4.5 \times 10^{16}$)/cm$^3$.

The results of Example 2 are summarized in Table 2.

TABLE 2

| No. | Composition at % | | | Carrier concentration (/cm$^3$) | mobility (cm$^2$/Vs) | Amorphous |
|---|---|---|---|---|---|---|
| | In | Sn | Ge | | | |
| 2-1 | 94.7 | 5.3 | 0 | 6.4E+20 | 31.0 | x |
| 2-2 | 90.2 | 4.9 | 4.9 | 1.6E+20 | 36.5 | x |
| 2-3 | 88.5 | 4.5 | 7 | 9.8E+18 | 33.2 | ○ |
| 2-4 | 83.5 | 4.3 | 12.2 | 7.4E+18 | 31.7 | ○ |
| 2-5 | 77.1 | 4.2 | 18.7 | 8.9E+18 | 24.5 | ○ |
| 2-6 | 71.9 | 4 | 24.1 | 9.5E+17 | 17.1 | ○ |
| 2-7 | 55.5 | 4.5 | 40 | 4.5E+16 | 10.2 | ○ |

Example 3

(Sample 3-1)

Using an In—Sn—Ge—O target, an In—Sn—Ge—O oxide semiconductor thin film in which the atom ratio of the respective elements in the total amount of In, Sn, and Ge was In: 88 atomic %, Sn: 7 atomic %, and Ge: 5 atomic % was prepared on a glass substrate. The resulting thin film was amorphous.

As a result of evaluating the electric characteristics of the prepared oxide semiconductor thin film, the mobility was 31.5 cm$^2$/Vs and the carrier concentration was 2.9E+20 (2.9×10$^{20}$)/cm$^3$.

(Sample 3-2)

Using an In—Sn—Ge—O target, an In—Sn—Ge—O oxide semiconductor thin film in which the atom ratio of the respective elements in the total amount of In, Sn, and Ge was In: 86 atomic %, Sn: 7 atomic %, and Ge: 7 atomic % was prepared on a glass substrate. The resulting thin film was amorphous.

As a result of evaluating the electric characteristics of the prepared oxide semiconductor thin film, the mobility was 30.2 cm$^2$/Vs and the carrier concentration was 1.0E+19 (1.0×10$^{19}$)/cm$^3$.

(Sample 3-3)

Using an In—Sn—Ge—O target, an In—Sn—Ge—O oxide semiconductor thin film in which the atom ratio of the respective elements in the total amount of In, Sn, and Ge was In: 80 atomic %, Sn: 7 atomic %, and Ge: 13 atomic % was prepared on a glass substrate. The resulting thin film was amorphous.

As a result of evaluating the electric characteristics of the prepared oxide semiconductor thin film, the mobility was 27.1 cm$^2$/Vs and the carrier concentration was 7.3E+18 (7.3×10$^{18}$)/cm$^3$.

(Sample 3-4)

Using an In—Sn—Ge—O target, an In—Sn—Ge—O oxide semiconductor thin film in which the atom ratio of the respective elements in the total amount of In, Sn, and Ge was In: 53 atomic %, Sn: 7 atomic %, and Ge: 40 atomic % was prepared on a glass substrate. The resulting thin film was amorphous.

As a result of evaluating the electric characteristics of the prepared oxide semiconductor thin film, the mobility was 11.0 cm$^2$/Vs and the carrier concentration was 8.1E+16 (8.1×10$^{16}$)/cm$^3$.

The results of Example 3 are summarized in Table 3.

TABLE 3

| No. | Composition at % | | | Carrier concentration (/cm$^3$) | Mobility (cm$^2$/Vs) | Amorphous |
|---|---|---|---|---|---|---|
| | In | Sn | Ge | | | |
| 3-1 | 88 | 7 | 5 | 2.9E+20 | 31.5 | ○ |
| 3-2 | 86 | 7 | 7 | 1.0E+19 | 30.2 | ○ |
| 3-3 | 80 | 7 | 13 | 7.3E+18 | 27.1 | ○ |
| 3-4 | 53 | 7 | 40 | 8.1E+16 | 11.0 | ○ |

Example 4

(Sample 4-1)

Using an In—Sn—Ge—O target, an In—Sn—Ge—O oxide semiconductor thin film in which the atom ratio of the respective elements in the total amount of In, Sn, and Ge was In: 77.1 atomic %, Sn: 18 atomic %, and Ge: 4.9 atomic % was prepared on a glass substrate. The resulting thin film was amorphous.

As a result of evaluating the electric characteristics of the prepared oxide semiconductor thin film, the mobility was 31.5 cm$^2$/Vs and the carrier concentration was 5.2E+20 (5.2×10$^{20}$)/cm$^3$.

(Sample 4-2)

Using an In—Sn—Ge—O target, an In—Sn—Ge—O oxide semiconductor thin film in which the atom ratio of the respective elements in the total amount of In, Sn, and Ge was In: 75 atomic %, Sn: 18 atomic %, and Ge: 7 atomic % was prepared on a glass substrate. The resulting thin film was amorphous.

As a result of evaluating the electric characteristics of the prepared oxide semiconductor thin film, the mobility was 32.0 cm$^2$/Vs and the carrier concentration was 3.1E+19 (3.1×10$^{19}$)/cm$^3$.

(Sample 4-3)

Using an In—Sn—Ge—O target, an In—Sn—Ge—O oxide semiconductor thin film in which the atom ratio of the respective elements in the total amount of In, Sn, and Ge was In: 71.4 atomic %, Sn: 18 atomic %, and Ge: 10.6 atomic % was prepared on a glass substrate. The resulting thin film was amorphous.

As a result of evaluating the electric characteristics of the prepared oxide semiconductor thin film, the mobility was 31.6 cm$^2$/Vs and the carrier concentration was 1.7E+19 (1.7×10$^{19}$)/cm$^3$.

(Sample 4-4)

Using an In—Sn—Ge—O target, an In—Sn—Ge—O oxide semiconductor thin film in which the atom ratio of the respective elements in the total amount of In, Sn, and Ge was In: 42 atomic %, Sn: 18 atomic %, and Ge: 40 atomic % was prepared on a glass substrate. The resulting thin film was amorphous.

As a result of evaluating the electric characteristics of the prepared oxide semiconductor thin film, the mobility was 10.5 cm$^2$/Vs and the carrier concentration was 6.6E+11 (6.6×10$^{11}$)/cm$^3$.

The results of Example 4 are summarized in Table 4.

TABLE 4

| No. | Composition at % | | | Carrier concentration (/cm$^3$) | Mobility (cm$^2$/Vs) | Amorphous |
|---|---|---|---|---|---|---|
| | In | Sn | Ge | | | |
| 4-1 | 77.1 | 18 | 4.9 | 5.2E+20 | 31.5 | ○ |
| 4-2 | 75 | 18 | 7 | 3.1E+19 | 32.0 | ○ |
| 4-3 | 71.4 | 18 | 10.6 | 1.7E+19 | 31.6 | ○ |
| 4-4 | 42 | 18 | 40 | 6.6E+11 | 10.5 | ○ |

Example 5

(Sample 5-1)

Using an In—Sn—Ge—O target, an In—Sn—Ge—O oxide semiconductor thin film in which the atom ratio of the respective elements in the total amount of In, Sn, and Ge was In: 67 atomic %, Sn: 30 atomic %, and Ge: 3 atomic % was prepared on a glass substrate. The resulting thin film was amorphous.

As a result of evaluating the electric characteristics of the prepared oxide semiconductor thin film, the mobility was 30.2 cm$^2$/Vs and the carrier concentration was 5.6E+20 (5.6×10$^{20}$)/cm$^3$.

(Sample 5-2)

Using an In—Sn—Ge—O target, an In—Sn—Ge—O oxide semiconductor thin film in which the atom ratio of the respective elements in the total amount of In, Sn, and Ge was In: 63 atomic %, Sn: 30 atomic %, and Ge: 7 atomic % was prepared on a glass substrate. The resulting thin film was amorphous.

As a result of evaluating the electric characteristics of the prepared oxide semiconductor thin film, the mobility was 32.8 cm$^2$/Vs and the carrier concentration was 3.3E+19 ($3.3 \times 10^{19}$)/cm$^3$.

(Sample 5-3)

Using an In—Sn—Ge—O target, an In—Sn—Ge—O oxide semiconductor thin film in which the atom ratio of the respective elements in the total amount of In, Sn, and Ge was In: 60 atomic %, Sn: 30 atomic %, and Ge: 10 atomic % was prepared on a glass substrate. The resulting thin film was amorphous.

As a result of evaluating the electric characteristics of the prepared oxide semiconductor thin film, the mobility was 30.0 cm$^2$/Vs and the carrier concentration was 1.5E+19 ($1.5 \times 10^{19}$)/cm$^3$.

(Sample 5-4)

Using an In—Sn—Ge—O target, an In—Sn—Ge—O oxide semiconductor thin film in which the atom ratio of the respective elements in the total amount of In, Sn, and Ge was In: 30 atomic %, Sn: 30 atomic %, and Ge: 40 atomic % was prepared on a glass substrate. The resulting thin film was amorphous.

As a result of evaluating the electric characteristics of the prepared oxide semiconductor thin film, the mobility was 11.5 cm$^2$/Vs and the carrier concentration was 7.7E+16 ($7.7 \times 10^{16}$)/cm$^3$.

The results of Example 5 are summarized in Table 5.

TABLE 5

| No. | Composition at % | | | Carrier concentration (/cm$^3$) | Mobility (cm$^2$/Vs) | Amorphous |
| | In | Sn | Ge | | | |
| --- | --- | --- | --- | --- | --- | --- |
| 5-1 | 67 | 30 | 3 | 5.6E+20 | 30.2 | ○ |
| 5-2 | 63 | 30 | 7 | 3.3E+19 | 32.8 | ○ |
| 5-3 | 60 | 30 | 10 | 1.5E+19 | 30.0 | ○ |
| 5-4 | 30 | 30 | 40 | 7.7E+16 | 11.5 | ○ |

Example 6

(Sample 6-1)

Using an In—Sn—Ge—O target, an In—Sn—Ge—O oxide semiconductor thin film in which the atom ratio of the respective elements in the total amount of In, Sn, and Ge was In: 36 atomic %, Sn: 60 atomic %, and Ge: 4 atomic % was prepared on a glass substrate. The resulting thin film was amorphous.

As a result of evaluating the electric characteristics of the prepared oxide semiconductor thin film, the mobility was 25.2 cm$^2$/Vs and the carrier concentration was 6.0E+20 ($6.0 \times 10^{20}$)/cm$^3$.

(Sample 6-2)

Using an In—Sn—Ge—O target, an In—Sn—Ge—O oxide semiconductor thin film in which the atom ratio of the respective elements in the total amount of In, Sn, and Ge was In: 33 atomic %, Sn: 60 atomic %, and Ge: 7 atomic % was prepared on a glass substrate. The resulting thin film was amorphous.

As a result of evaluating the electric characteristics of the prepared oxide semiconductor thin film, the mobility was 18.2 cm$^2$/Vs and the carrier concentration was 2.2E+19 ($2.2 \times 10^{19}$)/cm$^3$.

(Sample 6-3)

Using an In—Sn—Ge—O target, an In—Sn—Ge—O oxide semiconductor thin film in which the atom ratio of the respective elements in the total amount of In, Sn, and Ge was In: 31 atomic %, Sn: 60 atomic %, and Ge: 9 atomic % was prepared on a glass substrate. The resulting thin film was amorphous.

As a result of evaluating the electric characteristics of the prepared oxide semiconductor thin film, the mobility was 11.3 cm$^2$/Vs and the carrier concentration was 1.6E+19 ($1.6 \times 10^{19}$)/cm$^3$.

(Sample 6-4)

Using an In—Sn—Ge—O target, an In—Sn—Ge—O oxide semiconductor thin film in which the atom ratio of the respective elements in the total amount of In, Sn, and Ge was In: 2 atomic %, Sn: 58 atomic %, and Ge: 40 atomic % was prepared on a glass substrate. The resulting thin film was amorphous.

As a result of evaluating the electric characteristics of the prepared oxide semiconductor thin film, the mobility was 3.5 cm$^2$/Vs and the carrier concentration was 7.3E+16 ($7.3 \times 10^{16}$)/cm$^3$.

The results of Example 6 are summarized in Table 6.

TABLE 6

| No. | Composition at % | | | Carrier concentration (/cm$^3$) | Mobility (cm$^2$/Vs) | Amorphous |
| | In | Sn | Ge | | | |
| --- | --- | --- | --- | --- | --- | --- |
| 6-1 | 36 | 60 | 4 | 6.0E+20 | 25.2 | ○ |
| 6-2 | 33 | 60 | 7 | 2.2E+19 | 18.2 | ○ |
| 6-3 | 31 | 60 | 9 | 1.6E+19 | 11.3 | ○ |
| 6-4 | 2 | 58 | 40 | 7.3E+16 | 3.5 | ○ |

Example 7

(Sample 7-1)

Using an In—Sn—Ge—O target, an In—Sn—Ge—O oxide semiconductor thin film in which the atom ratio of the respective elements in the total amount of In, Sn, and Ge was In: 91 atomic %, Sn: 2 atomic %, and Ge: 7 atomic % was prepared on a glass substrate. The resulting thin film was crystalline.

As a result of evaluating the electric characteristics of the prepared oxide semiconductor thin film, the mobility was 35.2 cm$^2$/Vs and the carrier concentration was 8.9E+19 ($8.9 \times 10^{19}$)/cm$^3$.

(Sample 7-2)

Using an In—Sn—Ge—O target, an In—Sn—Ge—O oxide semiconductor thin film in which the atom ratio of the respective elements in the total amount of In, Sn, and Ge was In: 89 atomic %, Sn: 4 atomic %, and Ge: 7 atomic % was prepared on a glass substrate. The resulting thin film was amorphous.

As a result of evaluating the electric characteristics of the prepared oxide semiconductor thin film, the mobility was 33.2 cm$^2$/Vs and the carrier concentration was 9.8E+18 ($9.8 \times 10^{18}$)/cm$^3$.

(Sample 7-3)

Using an In—Sn—Ge—O target, an In—Sn—Ge—O oxide semiconductor thin film in which the atom ratio of the respective elements in the total amount of In, Sn, and Ge was In: 86 atomic %, Sn: 7 atomic %, and Ge: 7 atomic % was prepared on a glass substrate. The resulting thin film was amorphous.

As a result of evaluating the electric characteristics of the prepared oxide semiconductor thin film, the mobility was 30.2 cm$^2$/Vs and the carrier concentration was 1.0E+19 ($1.0 \times 10^{19}$)/cm$^3$.

(Sample 7-4)

Using an In—Sn—Ge—O target, an In—Sn—Ge—O oxide semiconductor thin film in which the atom ratio of the respective elements in the total amount of In, Sn, and Ge was In: 73 atomic %, Sn: 20 atomic %, and Ge: 7 atomic % was prepared on a glass substrate. The resulting thin film was amorphous.

As a result of evaluating the electric characteristics of the prepared oxide semiconductor thin film, the mobility was 32.0 cm$^2$/Vs and the carrier concentration was 3.1E+19 ($3.1\times10^{19}$)/cm$^3$.

(Sample 7-5)

Using an In—Sn—Ge—O target, an In—Sn—Ge—O oxide semiconductor thin film in which the atom ratio of the respective elements in the total amount of In, Sn, and Ge was In: 63 atomic %, Sn: 30 atomic %, and Ge: 7 atomic % was prepared on a glass substrate. The resulting thin film was amorphous.

As a result of evaluating the electric characteristics of the prepared oxide semiconductor thin film, the mobility was 30.8 cm$^2$/Vs and the carrier concentration was 3.3E+19 ($3.3\times10^{19}$)/cm$^3$.

(Sample 7-6)

Using an In—Sn—Ge—O target, an In—Sn—Ge—O oxide semiconductor thin film in which the atom ratio of the respective elements in the total amount of In, Sn, and Ge was In: 33 atomic %, Sn: 60 atomic %, and Ge: 7 atomic % was prepared on a glass substrate. The resulting thin film was amorphous.

As a result of evaluating the electric characteristics of the prepared oxide semiconductor thin film, the mobility was 18.2 cm$^2$/Vs and the carrier concentration was 2.2E+19 ($2.2\times10^{19}$)/cm$^3$.

The results of Example 7 are summarized in Table 7.

TABLE 7

| No. | Composition at % | | | Carrier concentration (/cm$^3$) | Mobility (cm$^2$/Vs) | Amorphous |
| --- | --- | --- | --- | --- | --- | --- |
| | In | Sn | Ge | | | |
| 7-1 | 91 | 2 | 7 | 8.9E+19 | 35.2 | x |
| 7-2 | 89 | 4 | 7 | 9.8E+18 | 33.2 | ○ |
| 7-3 | 86 | 7 | 7 | 1.0E+19 | 30.2 | ○ |
| 7-4 | 73 | 20 | 7 | 3.1E+19 | 32.0 | ○ |
| 7-5 | 63 | 30 | 7 | 3.3E+19 | 30.8 | ○ |
| 7-6 | 33 | 60 | 7 | 2.2E+19 | 18.2 | ○ |

Example 8

(Sample 8-1)

Using an In—Sn—Ge—O target, an In—Sn—Ge—O oxide semiconductor thin film in which the atom ratio of the respective elements in the total amount of In, Sn, and Ge was In: 58 atomic %, Sn: 2 atomic %, and Ge: 40 atomic % was prepared on a glass substrate. The resulting thin film was amorphous.

As a result of evaluating the electric characteristics of the prepared oxide semiconductor thin film, the mobility was 8.2 cm$^2$/Vs and the carrier concentration was 3.8E+16 ($3.8\times10^{16}$)/cm$^3$.

(Sample 8-2)

Using an In—Sn—Ge—O target, an In—Sn—Ge—O oxide semiconductor thin film in which the atom ratio of the respective elements in the total amount of In, Sn, and Ge was In: 56 atomic %, Sn: 4 atomic %, and Ge: 40 atomic % was prepared on a glass substrate. The resulting thin film was amorphous.

As a result of evaluating the electric characteristics of the prepared oxide semiconductor thin film, the mobility was 10.2 cm$^2$/Vs and the carrier concentration was 4.5E+16 ($4.5\times10^{16}$)/cm$^3$.

(Sample 8-3)

Using an In—Sn—Ge—O target, an In—Sn—Ge—O oxide semiconductor thin film in which the atom ratio of the respective elements in the total amount of In, Sn, and Ge was In: 53 atomic %, Sn: 7 atomic %, and Ge: 40 atomic % was prepared on a glass substrate. The resulting thin film was amorphous.

As a result of evaluating the electric characteristics of the prepared oxide semiconductor thin film, the mobility was 11.0 cm$^2$/Vs and the carrier concentration was 8.1E+16 ($8.1\times10^{16}$)/cm$^3$.

(Sample 8-4)

Using an In—Sn—Ge—O target, an In—Sn—Ge—O oxide semiconductor thin film in which the atom ratio of the respective elements in the total amount of In, Sn, and Ge was In: 40 atomic %, Sn: 20 atomic %, and Ge: 40 atomic % was prepared on a glass substrate. The resulting thin film was amorphous.

As a result of evaluating the electric characteristics of the prepared oxide semiconductor thin film, the mobility was 10.5 cm$^2$/Vs and the carrier concentration was 6.6E+16 ($6.6\times10^{16}$)/cm$^3$.

(Sample 8-5)

Using an In—Sn—Ge—O target, an In—Sn—Ge—O oxide semiconductor thin film in which the atom ratio of the respective elements in the total amount of In, Sn, and Ge was In: 30 atomic %, Sn: 30 atomic %, and Ge: 40 atomic % was prepared on a glass substrate. The resulting thin film was amorphous.

As a result of evaluating the electric characteristics of the prepared oxide semiconductor thin film, the mobility was 11.5 cm$^2$/Vs and the carrier concentration was 7.7E+16 ($7.7\times10^{16}$)/cm$^3$.

(Sample 8-6)

Using a Sn—Ge—O target, a Sn—Ge—O oxide semiconductor thin film in which the atom ratio of the respective elements in the total amount of In and Sn was Sn: 60 atomic % and Ge: 40 atomic % was prepared on a glass substrate. The resulting thin film was amorphous.

As a result of evaluating the electric characteristics of the prepared oxide semiconductor thin film, the mobility was 3.5 cm$^2$/Vs and the carrier concentration was 7.3E+16 ($7.3\times10^{16}$)/cm$^3$.

The results of Example 8 are summarized in Table 8.

TABLE 8

| No. | Composition at % | | | Carrier concentration (/cm$^3$) | Mobility (cm$^2$/Vs) | Amorphous |
| --- | --- | --- | --- | --- | --- | --- |
| | In | Sn | Ge | | | |
| 8-1 | 58 | 2 | 40 | 3.8E+16 | 8 2 | ○ |
| 8-2 | 56 | 4 | 40 | 4.5E+16 | 10.2 | ○ |
| 8-3 | 53 | 7 | 40 | 8.1E+16 | 11.0 | ○ |
| 8-4 | 40 | 20 | 40 | 6.6E+16 | 10.5 | ○ |
| 8-5 | 30 | 30 | 40 | 7.7E+16 | 11.5 | ○ |
| 8-6 | 0 | 60 | 40 | 7.3E+16 | 3.5 | ○ |

Example 9

(Sample 9-1)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 80 atomic %, Sn: 7 atomic %, Ge: 10 atomic %, and Ti: 3 atomic % was prepared on a glass substrate. The resulting thin film was amorphous.

As a result of evaluating the electric characteristics of the prepared oxide semiconductor thin film, the mobility was 21.8 cm$^2$/Vs and the carrier concentration was 2.3E+18 ($2.3 \times 10^{18}$)/cm$^3$.

(Sample 9-2)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 79 atomic %, Sn: 7 atomic %, Ge: 10 atomic %, and Ti: 4 atomic % was prepared on a glass substrate. The resulting thin film was amorphous.

As a result of evaluating the electric characteristics of the prepared oxide semiconductor thin film, the mobility was 18.8 cm$^2$/Vs and the carrier concentration was 1.9E+18 ($1.9 \times 10^{18}$)/cm$^3$.

(Sample 9-3)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 76 atomic %, Sn: 7 atomic %, Ge: 10 atomic %, and Ti: 7 atomic % was prepared on a glass substrate. The resulting thin film was amorphous.

As a result of evaluating the electric characteristics of the prepared oxide semiconductor thin film, the mobility was 15.0 cm$^2$/Vs and the carrier concentration was 7.9E+17 ($7.9 \times 10^{17}$)/cm$^3$.

(Sample 9-4)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 71 atomic %, Sn: 7 atomic %, Ge: 10 atomic %, and Ti: 12 atomic % was prepared on a glass substrate. The resulting thin film was amorphous.

As a result of evaluating the electric characteristics of the prepared oxide semiconductor thin film, the mobility was 6.5 cm$^2$/Vs and the carrier concentration was 1.2E+17 ($1.2 \times 10^{17}$)/cm$^3$.

(Sample 9-5)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 82 atomic %, Sn: 7 atomic %, Ge: 10 atomic %, and Ti: 1 atomic % was prepared on a glass substrate. The resulting thin film was amorphous.

As a result of evaluating the electric characteristics of the prepared oxide semiconductor thin film, the mobility was 25.9 cm$^2$/Vs and the carrier concentration was 9.0E+18 ($9.0 \times 10^{18}$)/cm$^3$.

(Sample 9-6)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 80 atomic %, Sn: 7 atomic %, Ge: 10 atomic %, and Ti: 3 atomic % was prepared on a glass substrate. The resulting thin film was amorphous.

As a result of evaluating the electric characteristics of the prepared oxide semiconductor thin film, the mobility was 20.5 cm$^2$/Vs and the carrier concentration was 3.4E+18 ($3.4 \times 10^{18}$)/cm$^3$.

(Sample 9-7)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 78 atomic %, Sn: 7 atomic %, Ge: 10 atomic %, and Ti: 5 atomic % was prepared on a glass substrate. The resulting thin film was amorphous.

As a result of evaluating the electric characteristics of the prepared oxide semiconductor thin film, the mobility was 18.9 cm$^2$/Vs and the carrier concentration was 1.9E+18 ($1.9 \times 10^{18}$)/cm$^3$.

(Sample 9-8)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 71 atomic %, Sn: 7 atomic %, Ge: 10 atomic %, and Ti: 12 atomic % was prepared on a glass substrate. The resulting thin film was amorphous.

As a result of evaluating the electric characteristics of the prepared oxide semiconductor thin film, the mobility was 8.9 cm$^2$/Vs and the carrier concentration was 6.1E+17 ($6.1 \times 10^{17}$)/cm$^3$.

(Sample 9-9)
Using a target obtained by adding Ti as the first element (α) to an In—Sn—Ge—O material, an In—Sn—Ge—Ti—O oxide semiconductor thin film in which the atom ratio of the respective elements in the total amount of In, Sn, Ge, and Ti was In: 79.5 atomic %, Sn: 7 atomic %, Ge: 10 atomic %, and Ti: 3.5 atomic % was prepared on a glass substrate. The resulting thin film was amorphous.

As a result of evaluating the electric characteristics of the prepared oxide semiconductor thin film, the mobility was 26.6 cm$^2$/Vs and the carrier concentration was 7.2E+18 ($7.2 \times 10^{18}$)/cm$^3$.

(Sample 9-10)
Using a target obtained by adding Ga as the second element (β) to an In—Sn—Ge—O material, an In—Sn—Ge—Ga—O oxide semiconductor thin film in which the atom ratio of the respective elements in the total amount of In, Sn, Ge, and Ti was In: 75.6 atomic %, Sn: 7 atomic %, Ge: 10 atomic %, and Ga: 7.4 atomic % was prepared on a glass substrate. The resulting thin film was amorphous.

As a result of evaluating the electric characteristics of the prepared oxide semiconductor thin film, the mobility was 22.4 cm$^2$/Vs and the carrier concentration was 3.6E+18 ($3.6 \times 10^{18}$)/cm$^3$.

(Sample 9-11)
Using a target obtained by adding Ga as the second element (β) to an In—Sn—Ge—O material, an In—Sn—Ge—Ga—O oxide semiconductor thin film in which the atom ratio of the respective elements in the total amount of In, Sn, Ge, and Ti was In: 69.7 atomic %, Sn: 7 atomic %, Ge: 10 atomic %, and Ga: 13.3 atomic % was prepared on a glass substrate. The resulting thin film was amorphous.

As a result of evaluating the electric characteristics of the prepared oxide semiconductor thin film, the mobility was 17.6 cm$^2$/Vs and the carrier concentration was 2.4E+18 ($2.4 \times 10^{18}$)/cm$^3$.

(Sample 9-12)

Using a target obtained by adding Ga as the second element (β) to an In—Sn—Ge—O material, an In—Sn—Ge—Ga—O oxide semiconductor thin film in which the atom ratio of the respective elements in the total amount of In, Sn, Ge, and Ti was In: 59 atomic %, Sn: 7 atomic %, Ge: 10 atomic %, and Ga: 24 atomic % was prepared on a glass substrate. The resulting thin film was amorphous.

As a result of evaluating the electric characteristics of the prepared oxide semiconductor thin film, the mobility was 10.2 cm$^2$/Vs and the carrier concentration was 1.0E+18 (1.0×10$^{18}$)/cm$^3$.

The results of Example 9 are summarized in Table 9.

TABLE 9

| No. | Composition at % | | | | Carrier concentration (/cm$^3$) | Mobility (cm$^2$/Vs) |
| --- | --- | --- | --- | --- | --- | --- |
|  | In | Sn | Ge | α/β |  |  |
| 9-1 | 80 | 7 | 10 | Ti 3 | 2.3E+18 | 21.8 |
| 9-2 | 79 | 7 | 10 | Ti 4 | 1.9E+18 | 18.8 |
| 9-3 | 76 | 7 | 10 | Ti 7 | 7.9E+17 | 15.0 |
| 9-4 | 71 | 7 | 10 | Ti 12 | 1.2E+17 | 6.5 |
| 9-5 | 82 | 7 | 10 | Ca 1 | 9.0E+18 | 25.9 |
| 9-6 | 80 | 7 | 10 | Ca 3 | 3.4E+18 | 20.5 |
| 9-7 | 78 | 7 | 10 | Ca 5 | 1.9E+18 | 18.9 |
| 9-8 | 71 | 7 | 10 | Ca 12 | 6.1E+17 | 8.9 |
| 9-9 | 79.5 | 7 | 10 | Ga 3.5 | 7.2E+18 | 26.6 |
| 9-10 | 75.6 | 7 | 10 | Ga 7.4 | 3.6E+18 | 22.4 |
| 9-11 | 69.7 | 7 | 10 | Ga 13.3 | 2.4E+18 | 17.6 |
| 9-12 | 59 | 7 | 10 | Ga 24 | 1.0E+18 | 10.2 |

From the results of Examples 1 to 8, the mobility tends to increase as the content of In is higher, and the carrier concentration tends to decrease as the content of Ge is higher. In particular, by setting the content of Ge to 7 atomic % or more, the carrier concentration in the film can be suppressed to 10$^{19}$/cm$^3$ order or less. Further, by setting the content of Ge to 40 atomic % or less, a higher mobility of approximately 20 to 35 cm$^2$/Vs can be obtained. Further, by suppressing the content of Ge to 40 atomic % or less, it is easy to obtain a mobility of 10 cm$^2$/Vs or more.

Meanwhile, the larger the content of Sn, it becomes easier to obtain an amorphous thin film. For example, by setting the content of Sn to 4 atomic % or more, an amorphous thin film can be obtained even in a sample having the content of Ge of 7 atomic % (see Sample 2-3). Further, the higher the content of Sn, it is possible to suppress the decrease in mobility with the increase in the content of Ge. It is favorable to optimize the content of Sn in accordance with the content of Ge, and the content of Sn is favorably 60 atomic % or less in order to ensure a mobility of 10 cm$^2$/Vs or more.

Further, from the results of Example 9, the carrier concentration decreases as the content of the first element (α) or the second element (β) increases, whereby it was confirmed that these elements function as carrier killers also in the In—Sn—Ge oxide semiconductor. Note that since the addition of the first element (α) or the second element (β) also lowers the mobility, it is favorable that the content of the first element (α) is 10 atomic % or less and the content of the second element (β) is 25 atomic % or less in order to ensure a mobility of 10 cm$^2$/Vs or more. Note that the minimum content of the first element (α) or the second element (β) is not particularly limited as long as the effect as the carrier killer can be confirmed, and may be 1 atomic % or less.

Example 10

(Sample 10-1)

Using an In—Sn—Ge—O target, an In—Sn—Ge—O oxide semiconductor thin film in which the atom ratio of the respective elements in the total amount of In, Sn, and Ge was In: 83 atomic %, Sn: 10 atomic %, and Ge: 7 atomic % was prepared by a sputtering method on a glass substrate. Using the prepared oxide semiconductor thin film as an active layer, thin film transistors having the structure shown in FIG. 1 were prepared, and the transistor characteristics (mobility, threshold voltage (Vth), PBTS (ΔVth), and NBTS (ΔVth)) thereof were evaluated.

As the PBTS (ΔVth), the amount of change in the threshold voltage after applying a gate voltage of +30 V at a temperature of 60° C. for 60 minutes was used.

As the NBTS- (ΔVth), the amount of change in the threshold voltage after applying a gate voltage of −30 V at a temperature of 60° C. for 60 minutes was used.

As the deposition conditions, the substrate temperature was 100° C., the sputtering gas was a mixed gas of argon and oxygen (oxygen content ratio of 7%), and the film thickness was 50 nm.

As the result of evaluation, the mobility was 44.3 cm$^2$/Vs, the threshold voltage (Vth) was 3.6 V, the PBTS (Vth) was +0.6 V, and the NBTS (Vth) was −1.0 V.

(Sample 10-2)

Using an In—Sn—Ge—O target, an In—Sn—Ge—O oxide semiconductor thin film in which the atom ratio of the respective elements in the total amount of In, Sn, and Ge was In: 73 atomic %, Sn: 20 atomic %, and Ge: 7 atomic % was prepared by a sputtering method on a glass substrate.

Using the prepared oxide semiconductor thin film as an active layer, thin film transistors having the structure shown in FIG. 1 were prepared, and the transistor characteristics (mobility, threshold voltage (Vth), PBTS (ΔVth), and NBTS (ΔVth)) thereof were evaluated.

As the result of evaluation, the mobility was 40.2 cm$^2$/Vs, the threshold voltage (Vth) was 3.5 V, the PBTS (Vth) was +0.6 V, and the NBTS (Vth) was −1.4 V.

(Sample 10-3)

Using an In—Sn—Ge—O target, an In—Sn—Ge—O oxide semiconductor thin film in which the atom ratio of the respective elements in the total amount of In, Sn, and Ge was In: 75 atomic %, Sn: 10 atomic %, and Ge: 15 atomic % was prepared by a sputtering method on a glass substrate.

Using the prepared oxide semiconductor thin film as an active layer, thin film transistors having the structure shown in FIG. 1 were prepared, and the transistor characteristics (mobility, threshold voltage (Vth), PBTS (ΔVth), and NBTS (ΔVth)) thereof were evaluated.

As the result of evaluation, the mobility was 37.2 cm$^2$/Vs, the threshold voltage (Vth) was 3.8 V, the PBTS (Vth) was +0.7 V, and the NBTS (Vth) was −0.9 V.

(Sample 10-4)

Using an In—Sn—Ge—O target, an In—Sn—Ge—O oxide semiconductor thin film in which the atom ratio of the respective elements in the total amount of In, Sn, and Ge was In: 65 atomic %, Sn: 20 atomic %, and Ge: 15 atomic % was prepared by a sputtering method on a glass substrate. Using the prepared oxide semiconductor thin film as an active layer, thin film transistors having the structure shown in FIG. 1 were prepared, and the transistor characteristics (mobility, threshold voltage (Vth), PBTS (ΔVth), and NBTS (ΔVth)) thereof were evaluated.

As the result of evaluation, the mobility was 31.2 cm²/Vs, the threshold voltage (Vth) was 4.0 V, the PBTS (Vth) was +0.6 V, and the NBTS (Vth) was −1.0 V.

(Sample 10-5)

Using an In—Sn—Ge—O target, an In—Sn—Ge—O oxide semiconductor thin film in which the atom ratio of the respective elements in the total amount of In, Sn, and Ge was In: 70 atomic %, Sn: 10 atomic %, and Ge: 20 atomic % was prepared by a sputtering method on a glass substrate. Using the prepared oxide semiconductor thin film as an active layer, thin film transistors having the structure shown in FIG. 1 were prepared, and the transistor characteristics (mobility, threshold voltage (Vth), PBTS (ΔVth), and NBTS (ΔVth)) thereof were evaluated.

As the result of evaluation, the mobility was 20.1 cm²/Vs, the threshold voltage (Vth) was 4.1 V, the PBTS (Vth) was +1.0 V, and the NBTS (Vth) was −0.7 V.

(Sample 10-6)

Using an In—Sn—Ge—O target, an In—Sn—Ge—O oxide semiconductor thin film in which the atom ratio of the respective elements in the total amount of In, Sn, and Ge was In: 60 atomic %, Sn: 20 atomic %, and Ge: 20 atomic % was prepared by a sputtering method on a glass substrate. Using the prepared oxide semiconductor thin film as an active layer, thin film transistors having the structure shown in FIG. 1 were prepared, and the transistor characteristics (mobility, threshold voltage (Vth), PBTS (ΔVth), and NBTS (ΔVth)) thereof were evaluated.

As the result of evaluation, the mobility was 19.8 cm²/Vs, the threshold voltage (Vth) was 4.2 V, the PBTS (Vth) was +0.9V V—, and the NBTS (Vth) was −0.6 V.

The results of Example 10 are summarized in Table 10.

TABLE 10

| No. | Composition at % | | | Mobility (cm²/Vs) | V th (V) | PBTS (ΔVth) | NBTS (ΔVth) |
| --- | --- | --- | --- | --- | --- | --- | --- |
| | In | Sn | Ge | | | | |
| 10-1 | 83 | 10 | 7 | 44.3 | 3.6 | 0.6 | −1.0 |
| 10-2 | 73 | 20 | 7 | 40.2 | 3.5 | 0.6 | −1.4 |
| 10-3 | 75 | 10 | 15 | 37.2 | 3.8 | 0.7 | −0.9 |
| 10-4 | 65 | 20 | 15 | 31.2 | 4.0 | 0.6 | −1.0 |
| 10-5 | 70 | 10 | 20 | 20.1 | 4.1 | 1.0 | −0.7 |
| 10-6 | 60 | 20 | 20 | 19.8 | 4.2 | 0.9 | −0.6 |

From the results of Example 10, in the thin film transistor using an In—Sn—Ge oxide semiconductor thin film having the content of Ge of 7 atomic % or more for an active layer, it was confirmed that a higher mobility of approximately 20 cm²/Vs or more could be obtained. In addition, it was confirmed that both PBTS characteristics and NBTS characteristics, which were indices of the reliability of the switching operation, had favorable values.

Although an embodiment of the present invention has been described above, it goes without saying that the present invention is not limited to the above-mentioned embodiment and various modifications can be made.

For example, a so-called bottom-gate type (inverted staggered) transistor is taken as an example in the embodiment described above, but the present invention is also applicable to a top-gate type (staggered) thin film transistor.

Further, the above-mentioned thin film transistor can be used as a TFT for an active matrix display panel such as a liquid crystal display and an organic EL display. Other than this, the above-mentioned transistor can be used as a transistor element of various semiconductor devices or electronic apparatuses.

REFERENCE SIGNS LIST 10 substrate
11 gate electrode
12 gate insulation film
13 active layer
14S source electrode
14D drain electrode
15 protective film

The invention claimed is:

1. An oxide semiconductor thin film, comprising:
an oxide semiconductor that mainly contains In, Sn, and Ge, wherein
an atom ratio of Ge/(In+Sn+Ge) is 0.07 or more and 0.40 or less.

2. The oxide semiconductor thin film according to claim 1, wherein
an atom ratio of Sn/(In+Sn+Ge) is 0.04 or more and 0.60 or less.

3. The oxide semiconductor thin film according to claim 1, wherein
an atom ratio of In/(In+Sn+Ge) is 0.3 or more and the atom ratio of Ge/(In+Sn+Ge) is 0.10 or more and 0.25 or less.

4. The oxide semiconductor thin film according to claim 1, wherein
the oxide semiconductor further contains a first element that is at least one element selected from the group consisting of Si, Ti, Mg, Ca, Ba, Zr, Al, W, Ta, Hf, and B.

5. The oxide semiconductor thin film according to claim 4, wherein
an atom ratio of α/(In+Sn+Ge+α) is 0.10 or less, α being the first element.

6. The oxide semiconductor thin film according to claim 1, wherein
the oxide semiconductor further contains a second element that is at least one element selected from the group consisting of Sr, Ga, and Zn.

7. The oxide semiconductor thin film according to claim 6, wherein
an atom ratio of β/(In+Sn+Ge+β) is 0.25 or less, β being the second element.

8. A thin film transistor, comprising:
an active layer including the oxide semiconductor thin film according to claim 1.

9. A method of producing a thin film transistor including an active layer including the oxide semiconductor thin film according to claim 1, comprising:
forming a gate insulation film on a gate electrode;
forming the active layer on the gate insulation film by a sputtering method;
forming a metal layer using the active layer as a base layer; and
forming a source electrode and a drain electrode by patterning the metal layer by a wet etching method.

10. A sputtering target, comprising:
a sintered body of an oxide semiconductor containing In, Sn, and Ge as main components, wherein
an atom ratio of Ge/(In+Sn+Ge) is 0.07 or more and 0.40 or less.

* * * * *